(12) United States Patent
Chandler et al.

(10) Patent No.: US 7,897,939 B2
(45) Date of Patent: *Mar. 1, 2011

(54) REMOVABLE LINERS FOR CHARGED PARTICLE BEAM SYSTEMS

(75) Inventors: Alan Michael Chandler, Milton, VT (US); Tushar Desai, South Burlington, VT (US); Ellis Craig Hayford, Williston, VT (US); Nicholas Mone, Jr., Essex Junction, VT (US); James Spiros Nakos, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 169 days.

This patent is subject to a terminal disclaimer.

(21) Appl. No.: 12/167,271

(22) Filed: Jul. 3, 2008

(65) Prior Publication Data
US 2008/0258081 A1 Oct. 23, 2008

Related U.S. Application Data

(63) Continuation of application No. 11/422,092, filed on Jun. 5, 2006, now Pat. No. 7,462,845.

(60) Provisional application No. 60/743,022, filed on Dec. 9, 2005.

(51) Int. Cl.
*G21K 5/00* (2006.01)
(52) U.S. Cl. .............. 250/492.2; 250/492.1; 250/492.21; 250/492.3
(58) Field of Classification Search ............... 250/492.1, 250/492.2, 492.21, 492.3
See application file for complete search history.

(56) References Cited

U.S. PATENT DOCUMENTS

| 4,425,660 | A |   | 1/1984  | Jones |
| 4,560,879 | A | * | 12/1985 | Wu et al. .................. 250/492.2 |
| 4,682,911 | A | * | 7/1987  | Moreland .................... 588/259 |
| 5,246,782 | A | * | 9/1993  | Kennedy et al. ............. 428/421 |
| 5,391,275 | A |   | 2/1995  | Mintz |
| 5,455,426 | A | * | 10/1995 | Forgey et al. ............ 250/492.21 |
| 5,886,355 | A | * | 3/1999  | Bright et al. ............ 250/492.21 |
| 5,947,053 | A | * | 9/1999  | Burnham et al. ............. 116/208 |
| 6,051,122 | A | * | 4/2000  | Flanigan ................. 204/298.11 |

(Continued)

FOREIGN PATENT DOCUMENTS

JP         63162861       6/1988

OTHER PUBLICATIONS

ISR, Jun. 27, 2007.

(Continued)

*Primary Examiner* — Bernard E Souw
*Assistant Examiner* — Michael Maskell
(74) *Attorney, Agent, or Firm* — Schmeiser, Olsen & Watts; Anthony J. Canale

(57) ABSTRACT

A method of improving the performance of charged beam apparatus. The method including: providing the apparatus, the apparatus comprising: a chamber having an interior surface; a pump port for evacuating the chamber; a substrate holder within the chamber; and a charged particle beam within the chamber, the charged beam generated by a source and the charged particle beam striking the substrate; and positioning one or more liners in contact with one or more different regions of the interior surface of the chamber, the liners preventing material generated by interaction of the charged beam and the substrate from coating the one or more different regions of the interior surface of the chamber.

24 Claims, 8 Drawing Sheets

U.S. PATENT DOCUMENTS

| | | | |
|---|---|---|---|
| 6,331,713 B1 * | 12/2001 | Smick et al. | 250/497.1 |
| 6,452,198 B1 * | 9/2002 | Mani et al. | 250/492.21 |
| 6,521,081 B2 | 2/2003 | DeOrnellas et al. | |
| 6,583,427 B1 * | 6/2003 | Edmonds et al. | 250/492.21 |
| 6,589,407 B1 | 7/2003 | Subramani et al. | |
| 6,608,315 B1 * | 8/2003 | Saadatmand et al. | 250/492.21 |
| 6,670,624 B1 * | 12/2003 | Adams et al. | 250/492.21 |
| 6,699,375 B1 | 3/2004 | Crocker | |
| 6,837,966 B2 | 1/2005 | Nishimoto et al. | |
| 7,078,710 B2 * | 7/2006 | Desai et al. | 250/492.21 |
| 7,462,845 B2 * | 12/2008 | Chandler et al. | 250/492.21 |
| 2002/0158213 A1 * | 10/2002 | Matsunaga et al. | 250/492.21 |
| 2005/0133736 A1 * | 6/2005 | Chen et al. | 250/492.21 |
| 2006/0284117 A1 * | 12/2006 | Vanderpot et al. | 250/492.21 |
| 2007/0102652 A1 * | 5/2007 | Ring et al. | 250/492.21 |

OTHER PUBLICATIONS

Office Action (mail date Jul. 21, 2010) for U.S. Appl. No. 12/168,168, filed Jul. 7, 2008; Conformation No. 6998.

* cited by examiner

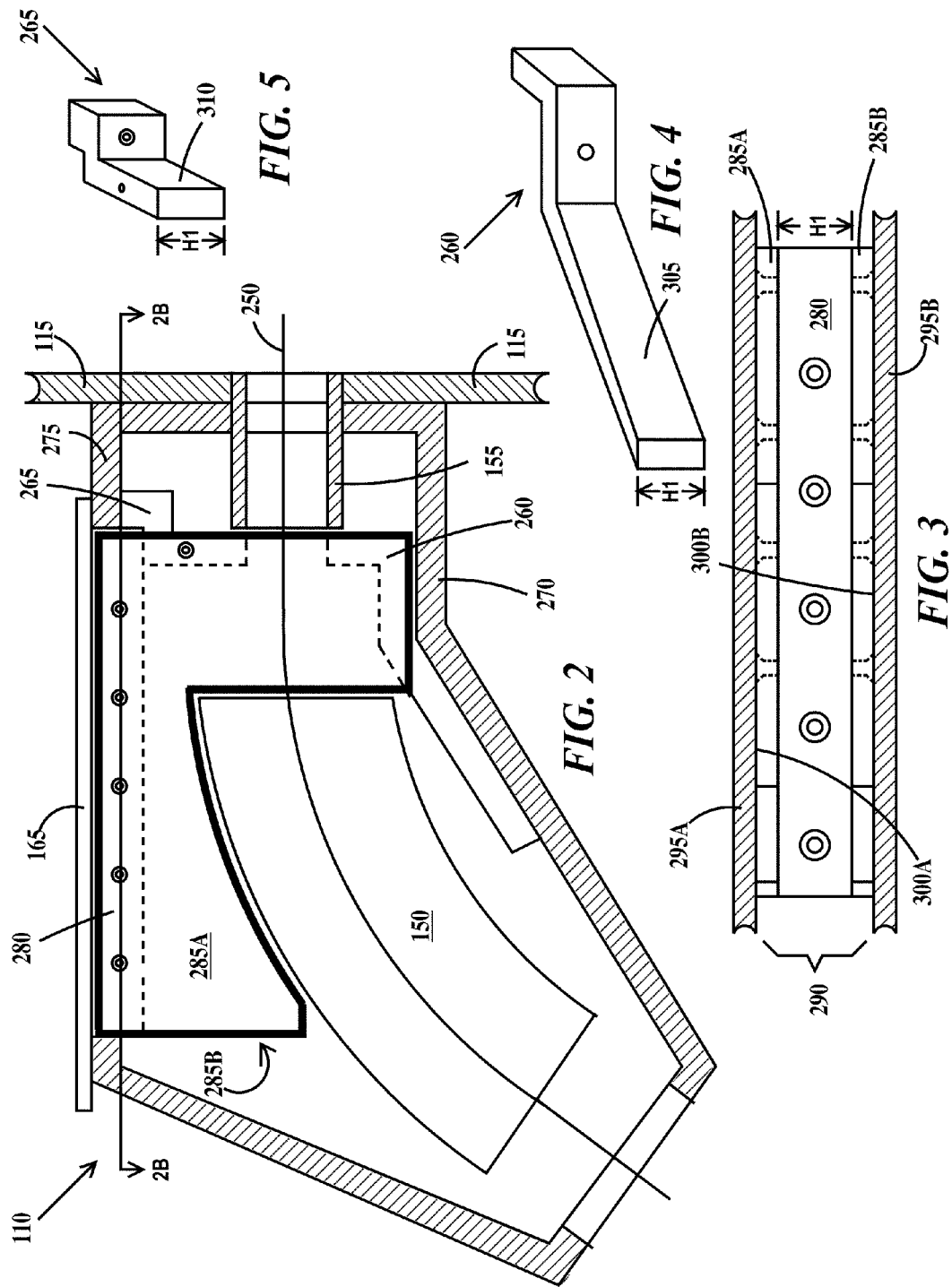

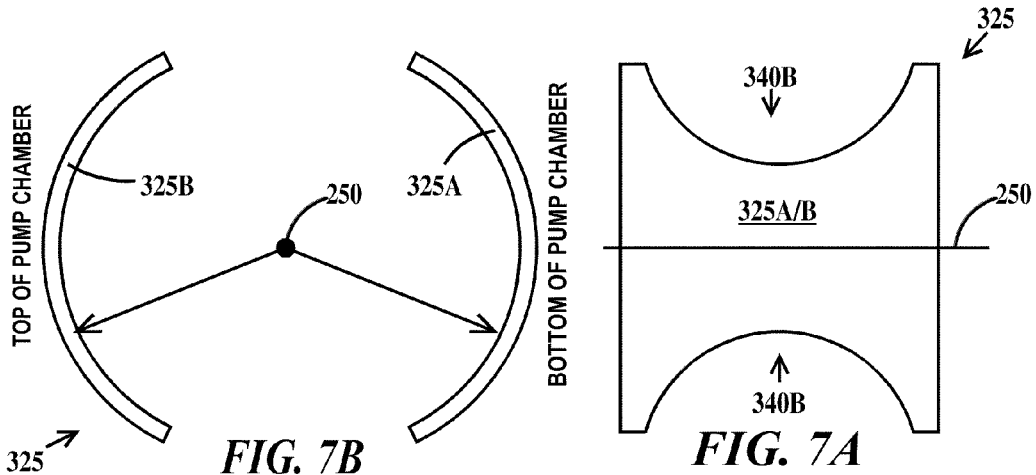
*FIG. 7B*     *FIG. 7A*
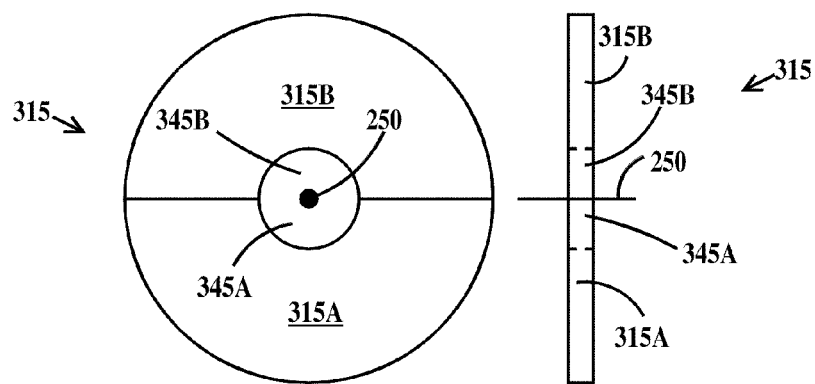
*FIG. 8B*     *FIG. 8A*
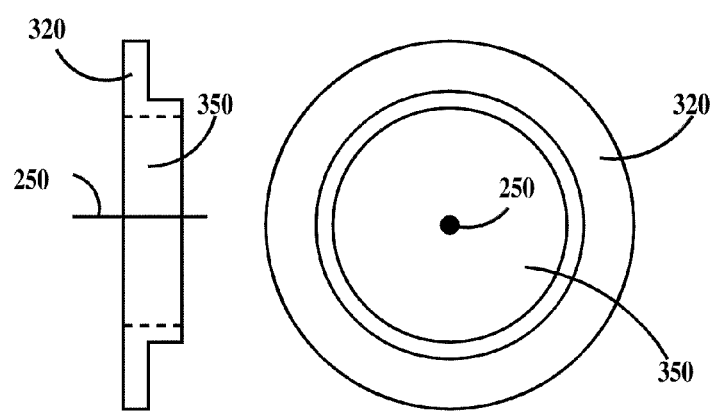
*FIG. 9A*     *FIG. 9B*

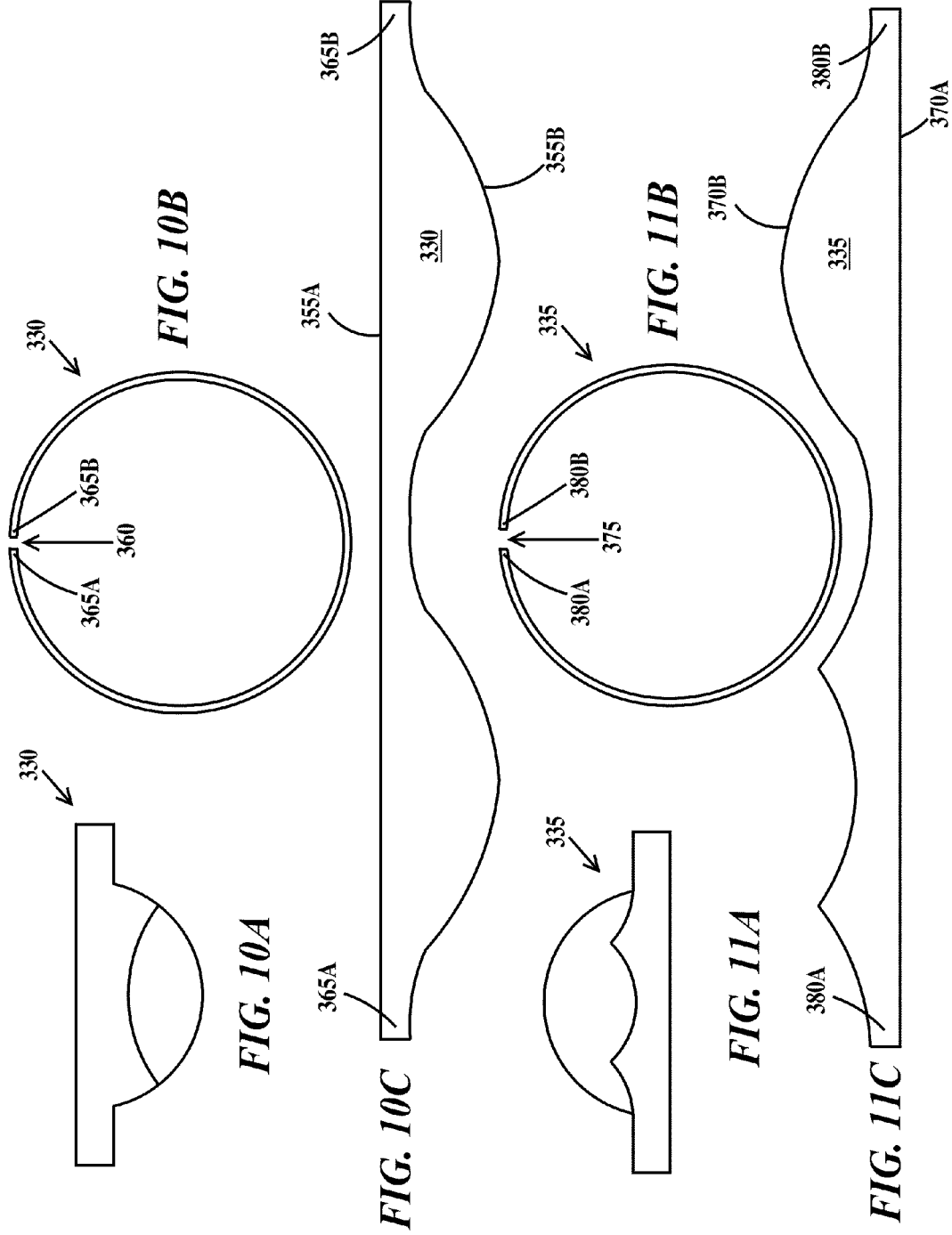

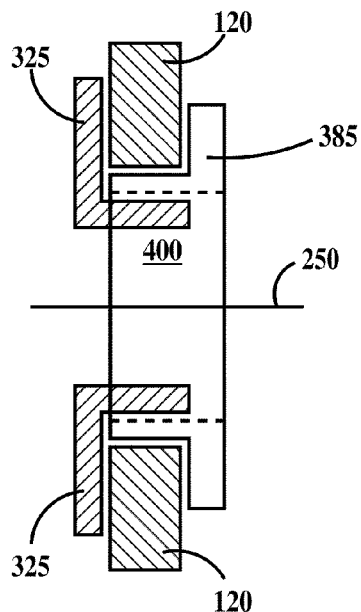
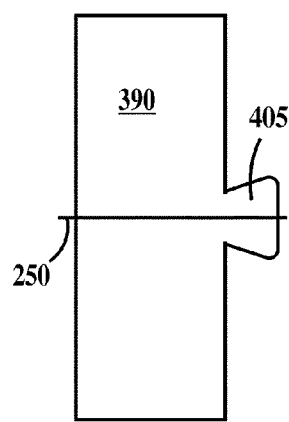
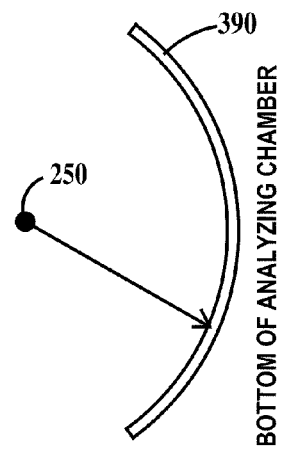
FIG. 13A      FIG. 14A      FIG. 14B
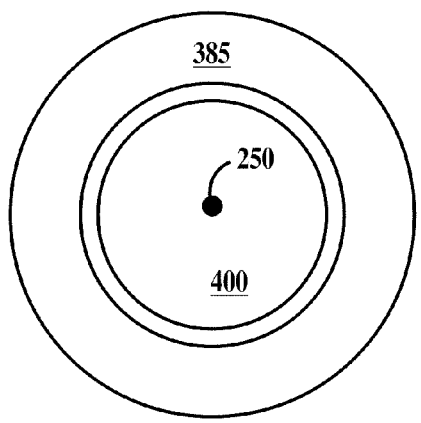
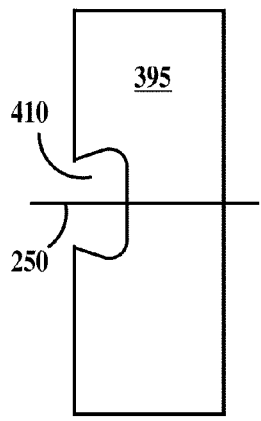
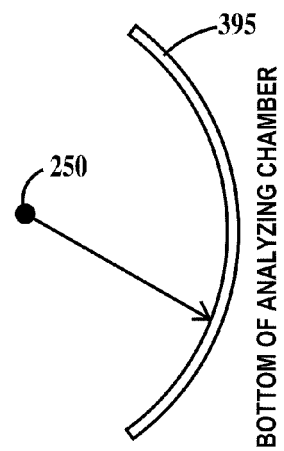
FIG. 13B      FIG. 15A      FIG. 15B

US 7,897,939 B2

REMOVABLE LINERS FOR CHARGED PARTICLE BEAM SYSTEMS

This application is a continuation of U.S. patent application Ser. No. 11/422,092 filed on Jun. 5, 2005 which claims priority of provisional application 60/743,022 filed on Dec. 9, 2005.

FIELD OF THE INVENTION

The present invention relates to the field of semiconductor fabrication tooling; more specifically, it relates to a method of improving the performance of charged particle beam fabrication tooling and apparatus for improving the performance of charged particle beam fabrication tooling.

BACKGROUND OF THE INVENTION

Ion implantation tools and other charged particle beam tools, are used extensively in the semiconductor industry. An ongoing problem is the deposition of foreign material on the wafers being processed. Existing methods of mitigating foreign material require extensive manual cleaning of tools after the loss of product to foreign material becomes excessive. Therefore, there is an ongoing need in the industry for a method of mitigating foreign material related product loss on wafers processed in ion implantation tools and other charged particle beam tools.

SUMMARY OF THE INVENTION

A first aspect of the present invention is a chamber having an interior surface; a pump port for evacuating the chambers; a substrate holder within the chamber; a charged particle beam within the chamber, the charged beam generated by a source and the charged particle beam striking the substrate; and one or more liners in contact with one or more different regions of the interior surface of the chamber, the liners preventing material generated by interaction of the charged beam and the substrate from coating the one or more different regions of the interior surface of the chamber.

A second aspect of the present invention is the first aspect, wherein each of the one or more liners is removable from the chamber.

A third aspect of the present invention is the first aspect, further including one or more access ports in the chamber, the one or more access ports having corresponding access port covers and wherein each of the one or more liners is removable through at least one of the one or more access ports.

A fourth aspect of the present invention is the first aspect, further including one or more access ports in the chamber, the one or more access ports having corresponding access port covers and wherein each of the one or more liners is removeably attached to one of the access port covers.

A fifth aspect of the present invention is the first aspect, wherein each of the one or more liners has a first surface and a opposite second surface, the first surface in contact with a region of the interior surface of the chamber and the second surface facing the charged particle beam.

A sixth aspect of the present invention is the fifth aspect, wherein the second surface of at least one of the one or more liners is textured.

A seventh aspect of the present invention is the first aspect, wherein each of the one or more liners has a surface contour designed to mate with a corresponding contour of a region of the interior surface of the chamber.

An eighth aspect of the present invention is the first aspect, wherein at least one of the one or more liners is compression fitted to a corresponding region of the interior surface of the chamber.

A ninth aspect of the present invention is the first aspect, wherein at least one of the one or more liners is removeably fastened to a corresponding region of the interior surface of the chamber.

A tenth aspect of the present invention is the first aspect, wherein at least one of the liners has a thickness of between about 0.05 inches and about 0.20 inches.

An eleventh aspect of the present invention is the first aspect, wherein the liners comprise aluminum or graphite.

A twelfth aspect of the present invention is the first aspect, wherein the liners are essentially free of iron, nickel, chrome, cobalt, molybdenum, beryllium, tungsten, titanium, tantalum, copper, magnesium, tin, indium, antimony, phosphorous, boron and arsenic.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 2 is a schematic top view of the analyzer chamber of FIG. 1 with removable liners in place;

FIG. 3 is a side view through line 2B-2B of FIG. 2 of the analyzer liner assembly of FIG. 1;

FIG. 4 is an isometric view of the inner shield of FIG. 1 and FIG. 5 is an isometric view of the outer shield of FIG. 1;

FIG. 7A is a top view and FIG. 7B is a side view of the pumping chamber liner of FIG. 6.

FIG. 8A is a side view and FIG. 8B is a front view of the first aperture liner of FIG. 6;

FIG. 9A is a side view and FIG. 9B is a front view of the second aperture liner of FIG. 6;

FIG. 10A is a top view, FIG. 10B is a front view and FIG. 10C is a flat projection view of the access port liner of FIG. 6;

FIG. 11A is a top view, FIG. 11B is a front view and FIG. 11C is a flat projection view of the pump port liner of FIG. 6;

FIG. 13A is a side view and FIG. 13B is a front view of the third aperture liner of FIG. 12r of FIG. 12;

FIG. 14A is a top view and FIG. 14B is a edge view of the first resolving chamber liner of FIG. 12;

FIG. 15A is a top view and FIG. 15B is a edge view of the second resolving chamber liner of FIG. 12.

DETAILED DESCRIPTION OF THE INVENTION

The term "charged particle beam tool or system" is defined to be any tool that generates a beam of charged atoms or molecules or other particles and is capable of directing that charged species to the surface of or into the body of a wafer or substrate. Examples of charged particle beam systems include but is not limited to ion implantation tools, ion milling tools and electron beam tools and other plasmas tools such as reactive ion etch (RIE) tools. A wafer is one type of semiconductor substrate.

Figure 1:
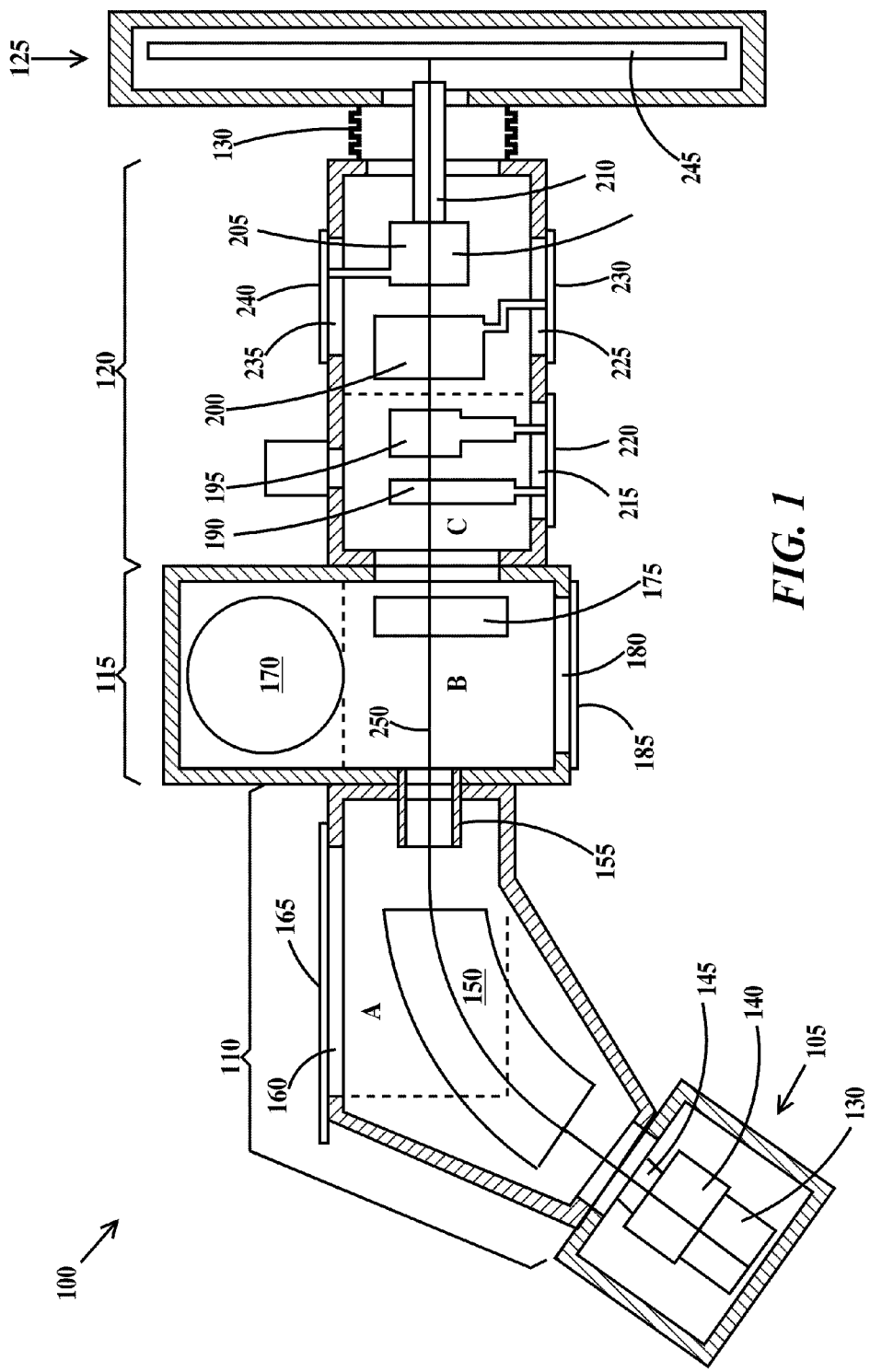
FIG. 1 a schematic top view of an exemplary ion implantation system according to a embodiment of the present invention.

FIG. 1 a schematic side view of an exemplary ion implantation system according to an embodiment of the present invention. In FIG. 1, an ion implantation system 100 includes a beam generation chamber 105, an analyzer chamber 110, a pumping chamber 115, a resolving chamber 120 and a wafer chamber 125 connected to resolving chamber 120 by a flexible bellows 130. The sidewalls of beam generation chamber 105, analyzer chamber 110, pumping chamber 115, resolving chamber 120 and wafer chamber 125 are illustrated in sectional view, all other structures are illustrated in plan view. Beam generation chamber 105 includes an ion/plasma source 135, an extractor 140 and a beam defining aperture 145. Analyzer chamber 110 includes pole ends 150 of an electromagnet (not shown), an exit tube 155 an access port 160 and a access port cover 165. Pumping chamber 115 includes a pumping port 170, a deflector aperture 175, an access port 180 and an access port cover 185. Resolving chamber 120 includes a selectable aperture 190, a beam sampler 195, an electromagnetic aperture 200, an electron shower aperture 205, an electron shower tube 210, a first access port 215, a first access port cover 220, a second access port 225, a second access port cover 230, a third access port 235 and a third access port cover 240. Wafer chamber 125 includes a slideable and rotatable-stage 245.

Beam generation chamber 105, analyzer chamber 110, pumping chamber 115, resolving chamber 120 and a wafer chamber 125 are all connected together by vacuum tight seals and evacuated through pump port 170. Additional pump ports may be provided, for example in beam generation chamber 105. Wafer chamber 125 can be tilted relative to resolving chamber 120. Beam generation chamber 105, analyzer chamber 110, pumping chamber 115, resolving chamber 120 and a wafer chamber 125 are fabricated from solid or hollow cast blocks of aluminum that are bored out. Electromagnetic pole end 150 comprises iron. Electron shower tube 210 comprises graphite and is negatively charged.

In operation, an ion plasma is generated within ion source 135 and ions extracted from the ion source by extractor 140 to generate an ion beam that is projected along a beam path 250 by the electromagnet. After being passing through defining aperture 145, the ion beam is passed through analyzer chamber 110 where only ions of a predetermined charge to mass ratio exit through exit aperture 155. After passing through pumping chamber 135, selectable aperture 190, beam sampler 195, electromagnetic aperture 200, electron shower aperture 205, and electron shower tube 210, the ion beam strikes a substrate on stage 245.

The exact locations and thicknesses of unwanted material layer formation is a function of the specific interior geometry and arrangement of components and the fabrication process being run, but in an example of one type of ion implantation tool these location occur in the analyzer, pumping and resolving chambers. These layers are formed by ions striking the walls and depositing there, materials (including photoresists) from the wafers vaporizing or being physically or chemically removed from the wafer as well as reaction of the ion/plasma beam with trace gases in the various chamber. When these layers become thick enough flakes break off and are swept down to the wafer chamber where they land on the wafers being processed. These flakes can have dimensions in the sub-micron regime.

There are several locations on the interior surfaces of analyzing chamber 110, pumping chamber 115 and resolving chamber 120 that layers of material my build up on. These regions are discernable by buildup of layers of material after operation of implanter over extended periods of time. In analyzing chamber 110, the top bottom and sidewalls in a region "A" partially defined by the dashed lines is a region of particularly heavy material deposition. In pumping chamber 115, virtually all surfaces in a region "B" partially defined by the dashed lines is a region of particularly heavy material deposition. In resolving chamber 120, lower surfaces in a region "C" partially defined by the dashed lines is a region of particularly heavy material deposition.

FIG. 2 is a schematic top view of the analyzer chamber 110 of FIG. 1 with removable liners in place. The sidewalls of analyzer chamber 110 are illustrated in sectional view, all other structures are illustrated in plan view. In FIG. 2, an analyzer inner foreign material shield 260 and an analyzer outer foreign material shield 265 are removeably attached to the respective sidewalls 270 and 275 of analyzer chamber 110. Removeably attached to access port cover 165 is an analyzer striker plate 280. Removeably attached to outer foreign material shield 260 and striker plate 280 are an analyzer upper liner 285A and an identical analyzer lower liner 285B illustrated by heavy lines for clarity.

In one example, liners 2885A and 285B comprise aluminum. In one example liners 285A and 285B are between about 0.05 inches and about 0.20 inches thick. In one example, outer foreign material shield 260, inner foreign material shield 265 and striker plate 280 are comprised of graphite or aluminum. Outer foreign material shield 260, inner foreign material shield 265 and striker plate 280 roughened or textured by, for example, by machining, bead blasting, sand blasting, or etching. It is advantageous from a contamination point of view that outer foreign material shield 260, inner foreign material shield 265, striker plate 280 and liners 285A and 285B not contain significant amounts (are essentially free) of iron, nickel, chrome, cobalt, molybdenum, beryllium, tungsten, titanium, tantalum, copper, magnesium, tin, indium, antimony, phosphorous, boron or arsenic. A feature of liners 285A and 285B is that they do not overlap electromagnetic pole end 150 so as not to interfere with the magnetic flux lines of the electromagnet.

FIG. 3 is a side view through line 2B-2B of FIG. 2 of an 290 analyzer liner assembly of FIG. 1. Analyzing chamber 110 (see FIG. 2) is rectangular in cross-section so analyzer assembly 290 comprising, striker plate 280 and liners 285A and 285B just fits in between a top wall 295A and a bottom wall 295B of analyzing chamber 110. Striker plate 280 has a height "H1" Inside surfaces 300A and 300B of respective liners 285A and 285B are advantageously roughened or textured by, for example, by machining, bead blasting, sand blasting, or etching.

FIG. 4 is an isometric view of the inner shield of FIG. 1 and FIG. 5 is an isometric view of the outer shield of FIG. 1. In FIG. 4, a region 305 of inner shield 260 has a height "H1" and in FIG. 5, a region 310 of inner shield 260 also has a height "H1."

Returning to FIG. 2, it can be seen that inner and outer shields 260 and 265 and striker plate 280 have a first function of collecting ionized species that do not have the required mass/charge ratio and as a consequence get coated with a layer of unwanted material. Thus inner and outer shields 260 and 265 and striker plate 280 serve a second function of preventing portions of the top and bottom walls of analyzer chamber from becoming coated with unwanted material. Liners 285A and 285B also become coated with unwanted layers of material. By removing access port cover 160, liners 285A and 285B as well as outer foreign material shield 260, inner foreign material shield 265, striker plate 280 may be periodically removed for cleaning, clean and then reinstalled or a previously cleaned replacement set of liners, shields and striker plate installed in the machine while the removed liners and shields are cleaned. In either case tool down time is significantly less than cleaning the chamber surfaces themselves and the cleaning is more thorough.

Figure 6:
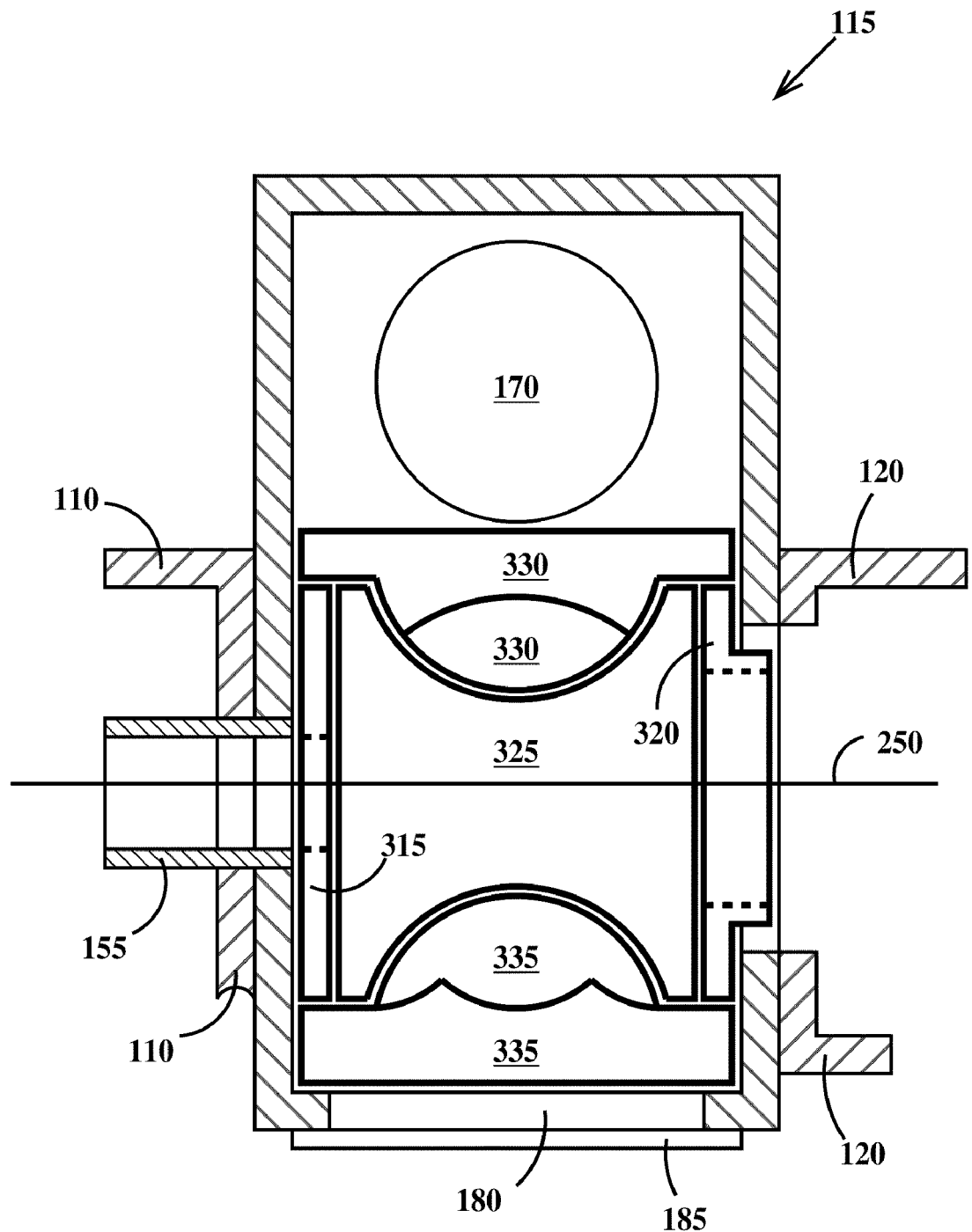
FIG. 6 is a schematic top view of the pumping chamber of FIG. 1 with removable liners in place.

FIG. 6 is a schematic top view of pumping chamber 115 of FIG. 1 with removable liners in place. The sidewalls of pumping chamber 115 are illustrated in sectional view, all other structures are illustrated in plan view. In FIG. 6, a first aperture liner 315, a second aperture liner 320, a pump chamber liner 325, a pump port liner 330 and an access port liner 335 (illustrated by heavy lines for clarity) are removeably positioned in contact with interior surfaces of pumping chamber 115. L liners 315, 320, 325, 330 and 335 are removed and installed through access port 180. By removing access port cover 185, liners 315, 320, 325, 330 and 335 may be periodically removed for cleaning, clean and then reinstalled or a previously cleaned replacement set of liners installed in the machine while the removed liners are cleaned. In either case tool down time is significantly less than cleaning the chamber surfaces themselves and the cleaning is more thorough.

While gaps are illustrated between liners 315, 320, 325, 330 and 335, these gaps are advantageously designed to be zero (liners touching) or as close to zero as practical without interfering with easy install and removal of the liners.

In one example, liners 315, 320, 325, 330 and 335 comprise aluminum. In one example liners 315, 320, 325, 330 and 335 are between about 0.05 inches and about 0.20 inches thick. Liners 315, 320, 325, 330 and 335 are roughened or textured by, for example, by machining, bead blasting, sand blasting, or etching blasting. It is advantageous from a contamination point of view that liners 315, 320, 325, 330 and 335 not contain significant amounts of iron, nickel, chrome, cobalt, molybdenum, beryllium, tungsten, titanium, tantalum, copper, magnesium, tin, indium, antimony, phosphorous, boron or arsenic.

FIG. 7A is a top view and FIG. 7B is a side view of pumping chamber liner 325 of FIG. 6. Pumping chamber liner 325 is comprised of two identical liners, a lower liner 325A and an upper liner 325B, which are curved along beam path 250 to fit the main bore of pumping chamber 115 (see FIG. 6) along the beam path direction. Notches 340A and 340B are curved to match the bore of an access port bore and a pump bore respectively.

FIG. 8A is a side view and FIG. 8B is a front view of first aperture liner 315 of FIG. 6. First aperture liner 315 is comprised of two identical liners, a lower liner 315A and an upper liner 315B with corresponding bores 345A and 345B centered along beam path 250.

FIG. 9A is a side view and FIG. 9B is a front view of second aperture liner 320 of FIG. 6. Second aperture liner 320 includes a circular bore 350 centered along beam path 250.

FIG. 10A is a top view, FIG. 10B is a front view and FIG. 10C is a flat projection view of pump port liner 330 of FIG. 6. In FIG. 10C, an outside edge 355A will face pump port 170 (see FIG. 6) and an inside edge 355B will face the interior of pumping chamber 115 (see FIG. 6). In FIG. 10B, the curves of inside edge 355B are shaped to match intersection of the pump port bore and the main bore of pumping chamber 115 (see FIG. 6) when rolled to form a ring having a gap 360 where edges 365A and 365B are proximate to each other. Gap 360 allows access port liner to "spring" or compression fit inside pumping chamber 115 (see FIG. 6).

FIG. 11A is a top view, FIG. 11B is a front view and FIG. 11C is a flat projection view of access port liner 335 of FIG. 6. In FIG. 11C, an outside edge 370A will face access port 170 (see FIG. 6) and an inside edge 370B will face the interior of pumping chamber 115 (see FIG. 6). In FIG. 11B, the curves of inside edge 370B are shaped to match intersection of the access port bore and the main bore of pumping chamber 115 (see FIG. 6) when rolled to form a ring having a gap 375 where edges 380A and 380B are proximate to each other. Gap 375 allows pump port liner to "spring" fit inside pumping chamber 115 (see FIG. 6).

Returning to FIG. 6, liners 320 and 325 are held in place by liner 315 which in turn is held in place by liners 330 and 335. Thus liners 315, 320, 325, 330 and 335 are can be easily removed for cleaning and clean liners easily installed.

Figure 12:
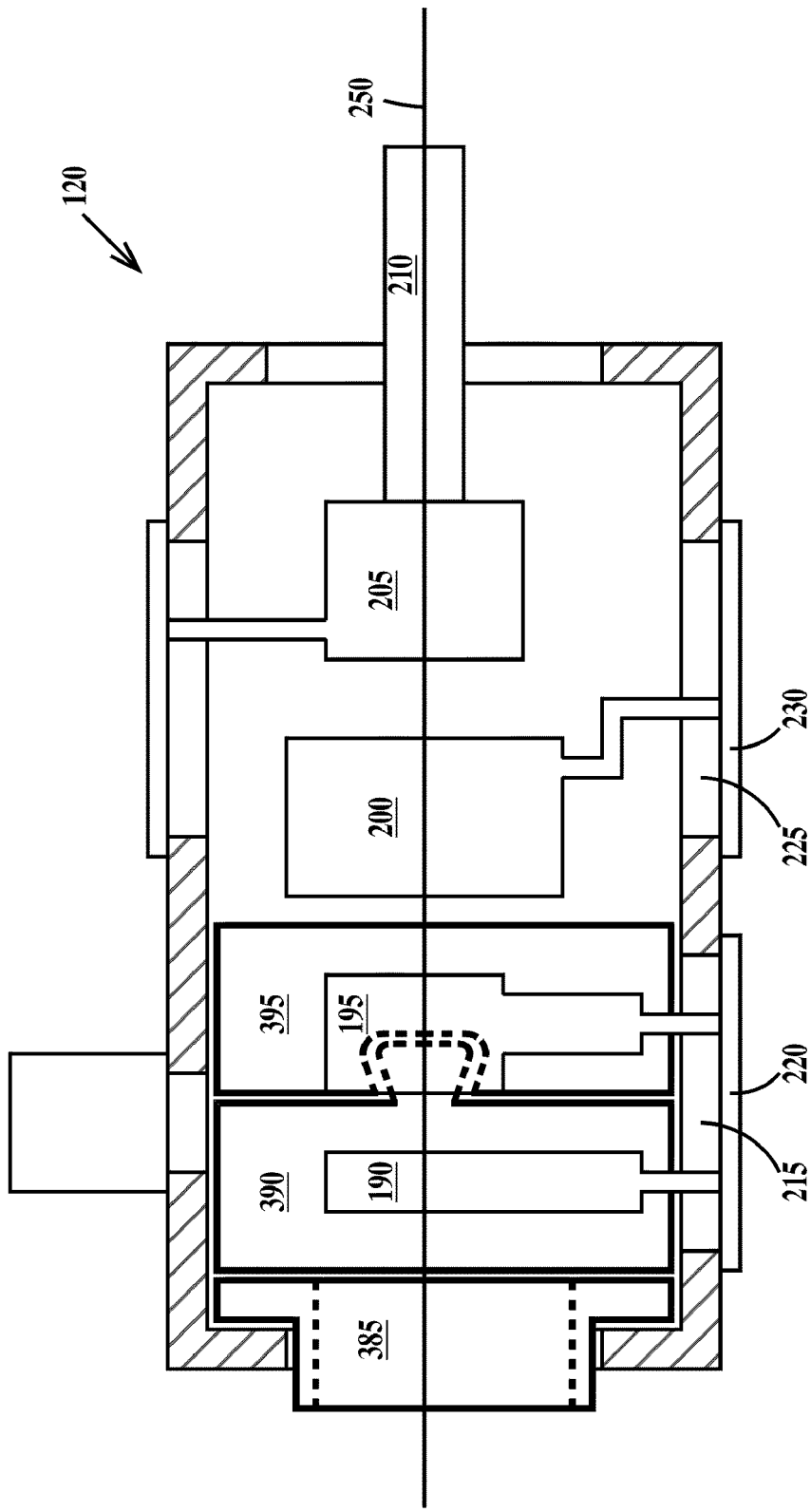
FIG. 12 is a schematic top view of the resolving chamber of FIG. 1 with removable liners in place.

FIG. 12 is a schematic top view of resolving chamber 120 of FIG. 1 with removable liners in place. The sidewalls of resolving chamber 120 are illustrated in sectional view, all other structures are illustrated in plan view. In FIG. 12, a third aperture liner 385, a first lower pump chamber liner 390, and a second lower pump chamber liner 395 are removeably positioned in contact with interior surfaces of resolving chamber 120. Liners 385, 390 and 395 are installed and removed through access port 215. By removing access port cover 220, liners 385, 390 and 395 may be periodically removed for cleaning, clean and then reinstalled or a previously cleaned replacement set of liners installed in the machine while the removed liners are cleaned. In either case tool down time is significantly less than cleaning the chamber surfaces themselves and the cleaning is more thorough.

While gaps are illustrated between liners 385, 390 and 395, these gaps are advantageously designed to be zero (liners just touching) or as close to zero as practical without interfering with easy install and removal of the liners.

In one example, liners 385, 390 and 395 comprise aluminum. In one example liners 385, 390 and 395 are between about 0.05 inches and about 0.20 inches thick. Liners 385, 390 and 395 are roughened or textured by, for example, by machining, bead blasting, sand blasting, or etching. It is advantageous from a contamination point of view that liners 385, 390 and 395 not contain significant amounts of iron, nickel, chrome, cobalt, molybdenum, beryllium, tungsten, titanium, tantalum, copper, magnesium, tin, indium, antimony, phosphorous, boron or arsenic.

FIG. 13A is a side view and FIG. 13B is a front view of third aperture liner 385 of FIG. 12. Third aperture liner 385 includes a circular bore 400 centered along beam path 250. Also illustrated in FIG. 13A, (in cross-section) is second aperture liner 325 and a portion of resolving chamber 120. It can be seen that second aperture liner 325 fits into bore 400 to prevent foreign material from being trapped between third aperture liner 385 and walls of resolving chamber 120.

FIG. 14A is a top view and FIG. 14B is a edge view of first resolving chamber liner 390 of FIG. 12. Liner 390 is curved along beam path 250 to fit the main bore of resolving chamber 120 (see FIG. 12) along the beam path direction. A key 405 is provided on one side of liner 390. Liner 390 is positioned on the bottom surfaces of resolving chamber 120 under selectable aperture 190, and beam sampler 195 (see FIG. 12).

FIG. 15A is a top view and FIG. 15B is a edge view of second resolving chamber liner 395 of FIG. 12. Liner 395 is curved along beam path 250 to fit the main bore of resolving chamber 120 (see FIG. 12) along the beam path direction. A keyhole 410 is provided on one side of liner 395. Liner 395 is positioned on the bottom surfaces of resolving chamber 120 under selectable aperture 190, and beam sampler 195 (see FIG. 12). Key 405 of liner 390 (see FIG. 14A) engages keyhole 410 of liner 395 when the liners are in place.

Returning to FIG. 12, there is no liner under electromagnetic aperture 200 and electron shower aperture 205 or on the upper surfaces of resolving chamber 120, because buildup of material in these locations is not significant. There are two options designing liners. The first option is to place liners over as many interior surfaces of the charged particle beam tools as possible without interfering with the operation of the tool. The second option is to place liners over only those interior surfaces of the charged particle beam tools where significant material buildup is expected (for example, cooler surfaces) or has been found to occur.

Figure 16:
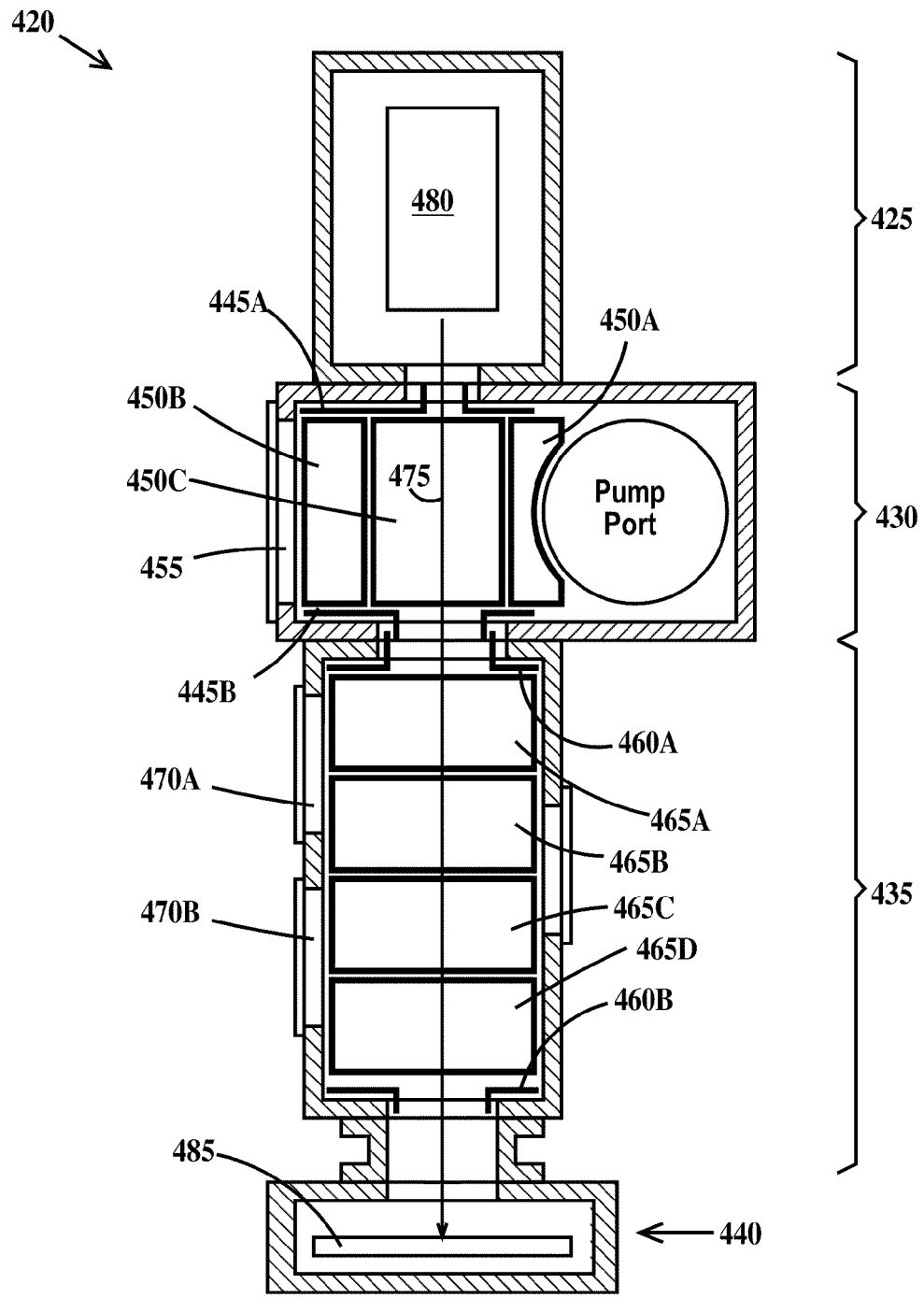
FIG. 16 is a schematic top view of an exemplary charge particle beam tool according to a embodiment of the present invention.

FIG. 16 is a schematic top view of an exemplary charged particle beam tool 420 according to a embodiment of the present invention. In FIG. 16, charged particle beam system 420 comprises a source chamber 425, a pumping chamber 430, a beam alignment/deflection chamber 435 and a target chamber 440. The arrangement of chambers can vary from tool to tool and some chambers may be combined into a single chamber. Pumping chamber 430 includes replaceable aperture liners 445A and 445B and replaceable pump chamber liners 450A, 450B and 450C which may be installed and removed through an access port 455. Beam alignment/deflection chamber 435 includes replaceable aperture liners 460A and 460B and replaceable pump chamber liners 465A, 465B, 465C and 465D which may be installed and removed through an access ports 470A and 470B.

A charged particle beam 475 is generated in source chamber 420 by a beam source 480, passes through pump chamber 430, beam alignment/deflection 435 and strikes a target 485 in target chamber 440. In one example, beam 475 comprises a species selected from the group consisting of phosphorus containing species ions, boron containing species ions, arsenic containing species ions, germanium containing species ions, carbon containing species ions, nitrogen containing species ions, helium ions, electrons, protons, or combinations thereof.

All liners 445A, 445B, 450A, 450B, 450C, 460A, 460B, 465A, 465B, 465C and 465D are formed of material selected to not contain chemical elements detrimental to the operation of or process being performed by tool 420. Liners 445A, 445B, 450A, 450B, 450C, 460A, 460B, 465A, 465B, 465C and 465D may be held in place by compression, fasteners or gravity. There may be more or less liners than the number shown in FIG. 16. The surfaces of liners 445A, 445B, 450A, 450B, 450C, 460A, 460B, 465A, 465B, 465C and 465D away from the inside surfaces of the various chambers may be advantageously roughened or textured by machining, bead blasting, sand blasting, or etching. Liners 445A, 445B, 450A, 450B, 450C, 460A, 460B, 465A, 465B, 465C and 465D may be cleanable or disposable.

Thus, the embodiments of the present invention provide an apparatus and a method of mitigating foreign material related product loss on wafers processed in ion implantation tools and other charged particle beam tools.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of improved cleaning of an ion implantation apparatus claim, comprising:
    providing said ion implantation apparatus, said ion implantation apparatus comprising:
        a beam generation chamber connected to an analyzer chamber connected to a pumping chamber connected to a resolving chamber connected to a wafer chamber, said analyzer, pumping and resolving chambers having interior surfaces;
        an access port in said analyzing chamber, said access port having a corresponding access port cover;
        when in operation, a charged particle beam generated in said beam generation chamber and passing through said analyzer pumping chamber and said resolving chamber to a semiconductor substrate in said wafer chamber; and
        an electromagnet having poles positioned within said analyzer chamber and deflecting said charged particle beam onto said substrate;
    positioning one or more removable liners in contact with one or more different interior surfaces of one or more of said analyzer, pumping and resolving chambers, said liners preventing material generated by interaction of said charged beam and said substrate from coating said one or more different interior surfaces of regions of said analyzer, pumping and resolving chambers;
    wherein said one or more liners positioned in said analyzer chamber do not cover said poles of said electromagnet when positioned in said analyzer chamber;
    wherein one or more liners positioned in said analyzer chamber are removeably attached to said access port cover; and
    placing a first liner, a second liner, a third liner and a fourth liner in said analyzing chamber, said analyzing chamber having opposite first and second sidewalls connecting opposite top and bottom surfaces, said first liner adjacent to said second aperture and extending along said first sidewall, said second liner adjacent to said second aperture and extending along said second sidewall, said third liner adjacent to said second aperture and extending along said top surface, said fourth liner adjacent to said second aperture and extending along said bottom surface, said third and fourth liners mechanically fastened to first and second liners, said first liner mechanically fastened to an access port cover of said analyzing chamber, said third and fourth liners not covering said first and second pole ends.

2. The method of claim 1, said ion implantation apparatus further including:
    one or more access ports in said analyzer chamber, said one or more access ports having corresponding access port covers; and
    wherein each liner positioned in said analyzer chamber is removable through at least one of said one or more access ports after a corresponding access port cover is removed.

3. The method of claim 1, said ion implantation apparatus further including:
    one or more access ports in said analyzer chamber, said one or more access ports having corresponding access port covers; and
    wherein each liner positioned in said analyzer chamber is removable through at least one of said one or more access ports after a corresponding access port cover is removed.

4. The method of claim 1, wherein each of said one or more liners has a first surface and an opposite second surface, said first surface in contact with a region of said interior surface of one of said analyzer, pumping and analyzer chambers and said second surface facing said charged particle beam, and wherein said second surfaces of said one or more liners is textured.

5. The method of claim 1, further including:
after exposed surfaces of said one or more liners become contaminated with material generated in said ion implantation apparatus, removing contaminated liners from said ion implantation apparatus and replacing said removed liners with corresponding identical uncontaminated liners.

6. The method of claim 5, further including:
after said removing contaminated liners, removing said material from said exposed surfaces of said removed liners and repositioning said removed liners in said ion implantation apparatus.

7. The method of claim 1, wherein said one or more removable liners comprise aluminum.

8. The method of claim 1, wherein said one or more removable liners are textured by sand blasting.

9. The method of claim 1, wherein said one or more removable liners are essentially free of iron, nickel, chrome, cobalt, molybdenum, beryllium, tungsten, titanium, tantalum, copper, magnesium, tin, indium, antimony, phosphorous, boron and arsenic.

10. The method of claim 1, wherein said one or more removable liners independently have thicknesses of between about 0.05 inches and about 0.20 inches.

11. A method of improved cleaning of an ion implantation apparatus claim, comprising:
providing said ion implantation apparatus, said ion implantation apparatus comprising:
a beam generation chamber connected to an analyzer chamber connected to a pumping chamber connected to a resolving chamber connected to a wafer chamber, said analyzer, pumping and resolving chambers having interior surfaces;
an access port in said analyzing chamber, said access port having a corresponding access port cover;
when in operation, a charged particle beam generated in said beam generation chamber and passing through said analyzer pumping chamber and said resolving chamber to a semiconductor substrate in said wafer chamber; and
an electromagnet having poles positioned within said analyzer chamber and deflecting said charged particle beam onto said substrate;
positioning one or more removable liners in contact with one or more different interior surfaces of one or more of said analyzer, pumping and resolving chambers, said liners preventing material generated by interaction of said charged beam and said substrate from coating said one or more different interior surfaces of regions of said analyzer, pumping and resolving chambers;
wherein said one or more liners positioned in said analyzer chamber do not cover said poles of said electromagnet when positioned in said analyzer chamber;
wherein one or more liners positioned in said analyzer chamber are removeably attached to said access port cover; and
placing a first liner, a second liner, a third liner, a fourth liner, a fifth liner and a sixth liner in said pumping chamber, said first liner in the shape of a ring and located adjacent to said second aperture, said second liner comprising in the shape of a ring and located adjacent to said third aperture, said third liner in contact with a bottom surface of said pumping chamber and said fourth liner in contact with a top surface of said pumping chamber, said fifth liner positioned adjacent to a pumping port of said pumping chamber, said sixth liner positioned adjacent to an access port of said pumping chamber, said fifth and sixth liners comprising a curved plate rolled to match a bore of said pumping chamber and compression fitted to a surface of said bore.

12. The method of claim 11, including:
one or more access ports in said analyzer chamber, said one or more access ports having corresponding access port covers;
wherein each liner positioned in said analyzer chamber is removable through at least one of said one or more access ports after a corresponding access port cover is removed;
one or more access ports in said analyzer chamber, said one or more access ports having corresponding access port covers;
wherein each liner positioned in said analyzer chamber is removable through at least one of said one or more access ports after a corresponding access port cover is removed;
wherein each of said one or more liners has a first surface and an opposite second surface, said first surface in contact with a region of said interior surface of one of said analyzer, pumping and analyzer chambers and said second surface facing said charged particle beam; and
wherein said second surfaces of said one or more liners is textured.

13. The method of claim 11; further including:
after exposed surfaces of said one or more liners become contaminated with material generated in said ion implantation apparatus, removing contaminated liners from said ion implantation apparatus and replacing said removed liners with corresponding identical uncontaminated liners; or
after said removing contaminated liners, removing said material from said exposed surfaces of said removed liners and repositioning said removed liners in said ion implantation apparatus.

14. The method of claim 1, wherein said one or more removable liners comprise aluminum that is essentially free of iron, nickel, chrome, cobalt, molybdenum, beryllium, tungsten, titanium, tantalum, copper, magnesium, tin, indium, antimony, phosphorous, boron and arsenic.

15. A method of improved cleaning of an ion implantation apparatus claim, comprising:
providing said ion implantation apparatus, said ion implantation apparatus comprising:
a beam generation chamber connected to an analyzer chamber connected to a pumping chamber connected to a resolving chamber connected to a wafer chamber, said analyzer, pumping and resolving chambers having interior surfaces;
an access port in said analyzing chamber, said access port having a corresponding access port cover;
when in operation, a charged particle beam generated in said beam generation chamber and passing through said analyzer pumping chamber and said resolving chamber to a semiconductor substrate in said wafer chamber; and
an electromagnet having poles positioned within said analyzer chamber and deflecting said charged particle beam onto said substrate;
positioning one or more removable liners in contact with one or more different interior surfaces of one or more of said analyzer, pumping and resolving chambers, said liners preventing material generated by interaction of said charged beam and said substrate from coating said one or more different interior surfaces of regions of said analyzer, pumping and resolving chambers;

wherein said one or more liners positioned in said analyzer chamber do not cover said poles of said electromagnet when positioned in said analyzer chamber;

wherein one or more liners positioned in said analyzer chamber are removeably attached to said access port cover; and placing a first liner, a second liner and a third liner in said resolving chamber, said first liner adjacent to said third aperture, said second liner positioned in a first region of said resolving chamber and adjacent to said first liner; said third liner positioned in a second region of said resolving chamber and adjacent to said second liner.

16. The method of claim 15, wherein said one or more removable liners comprise aluminum.

17. The method of claim 15, wherein said one or more removable liners are textured by sand blasting.

18. The method of claim 15, wherein said one or more removable liners are essentially free of iron, nickel, chrome, cobalt, molybdenum, beryllium, tungsten, titanium, tantalum, copper, magnesium, tin, indium, antimony, phosphorous, boron and arsenic.

19. The method of claim 15, wherein said one or more removable liners independently have thicknesses of between about 0.05 inches and about 0.20 inches.

20. The method of claim 15, said ion implantation apparatus further including:

an access port in said pumping chamber, said access port having a corresponding access port cover; and wherein all liners positioned in said pumping chamber are removable through said access port after said access port cover is removed.

21. The method of claim 15, said ion implantation apparatus further including:

one or more access ports in said analyzer chamber, said one or more access ports having corresponding access port covers; and wherein each liner positioned in said analyzer chamber is removable through at least one of said one or more access ports after a corresponding access port cover is removed.

22. The method of claim 15, wherein each of said one or more liners has a first surface and an opposite second surface, said first surface in contact with a region of said interior surface of one of said analyzer, pumping and analyzer chambers and said second surface facing said charged particle beam, and wherein said second surfaces of said one or more liners is textured.

23. The method of claim 15, further including:

after exposed surfaces of said one or more liners become contaminated with material generated in said ion implantation apparatus, removing contaminated liners from said ion implantation apparatus and replacing said removed liners with corresponding identical uncontaminated liners.

24. The method of claim 23, further including:

after said removing contaminated liners, removing said material from said exposed surfaces of said removed liners and repositioning said removed liners in said ion implantation apparatus.

* * * * *